US008759900B2

(12) United States Patent
Sim

(10) Patent No.: US 8,759,900 B2
(45) Date of Patent: Jun. 24, 2014

(54) SEMICONDUCTOR MEMORY DEVICES

(71) Applicant: Samsung Electronics, Co., Ltd., Suwon-si (KR)

(72) Inventor: Jae-Hwang Sim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/742,557

(22) Filed: Jan. 16, 2013

(65) Prior Publication Data

US 2013/0256778 A1 Oct. 3, 2013

(30) Foreign Application Priority Data

Mar. 30, 2012 (KR) ........................ 10-2012-0033084

(51) Int. Cl.
*H01L 29/788* (2006.01)

(52) U.S. Cl.
USPC ............ 257/316; 257/318; 257/319; 257/324

(58) Field of Classification Search
USPC ................................. 257/316, 318, 319, 324
See application file for complete search history.

(56) References Cited

U.S. PATENT DOCUMENTS

| | | | |
|---|---|---|---|
| 7,879,674 | B2 | 2/2011 | Forbes et al. |
| 2007/0272966 | A1 | 11/2007 | Nishida et al. |
| 2008/0272424 | A1 | 11/2008 | Kim et al. |
| 2009/0256192 | A1 | 10/2009 | Fujitsuka et al. |
| 2011/0001181 | A1 | 1/2011 | Ju et al. |

FOREIGN PATENT DOCUMENTS

| | | | |
|---|---|---|---|
| JP | 2009-141248 | | 6/2009 |
| KR | 10-2006-0133166 | A | 12/2006 |
| KR | 10-2009-0104252 | A | 10/2009 |
| KR | 10-2010-0010732 | A | 2/2010 |

*Primary Examiner* — Tan N Tran
(74) *Attorney, Agent, or Firm* — Lee & Morse, P.C.

(57) ABSTRACT

A semiconductor memory device includes a substrate including a cell region and a peripheral region, word lines on the substrate of the cell region, each of the word lines including a charge storing part and a control gate electrode sequentially stacked, and a peripheral gate pattern on the substrate of the peripheral region. Each of the control gate electrode and the peripheral gate pattern includes a high-carbon semiconductor pattern and a low-carbon semiconductor pattern, the low-carbon semiconductor pattern being on the high-carbon semiconductor pattern.

10 Claims, 19 Drawing Sheets

SEMICONDUCTOR MEMORY DEVICES

CROSS-REFERENCE TO RELATED APPLICATIONS

The present application claims priority under 35 U.S.C. §119 to Korean Patent Application No. 10-2012-0033084, filed on Mar. 30, 2012, in the Korean Intellectual Property Office, and entitled: "Semiconductor Memory Devices," which is incorporated by reference herein in its entirety.

BACKGROUND

1. Field

Embodiments relate to a semiconductor devices and, more particularly, to a semiconductor memory device.

2. Description of the Related Art

Semiconductor devices may be used in various ways in the electronics industry because of their small size, multi-functionality, and/or low manufacturing cost thereof. Semiconductor devices may be classified into semiconductor memory devices for storing logic data, semiconductor logic devices for processing logic data, and hybrid semiconductor devices having both the function of the semiconductor memory device and the function of the semiconductor logic device. The electronics industry has increasingly desired improved characteristics for semiconductor devices. For example, high reliability, high speed, and/or multi-functionality of semiconductor devices have been increasingly desired. Accordingly, structures of semiconductor devices have become more and more complicated, and semiconductor devices have become highly integrated.

SUMMARY

Embodiments are directed to a semiconductor memory device including a substrate including a cell region and a peripheral region, word lines on the substrate in the cell region, each of the word lines including a sequentially stacked charge storing part and control gate electrode, and a peripheral gate pattern on the substrate in the peripheral region. Each of the control gate electrode and the peripheral gate pattern includes a high-carbon semiconductor pattern and a low-carbon semiconductor pattern, the low-carbon semiconductor pattern being on the high-carbon semiconductor pattern.

A carbon concentration of the high-carbon semiconductor pattern may be about three or more times greater than a carbon concentration of the low-carbon semiconductor pattern.

The high-carbon semiconductor pattern may be thicker than the low-carbon semiconductor pattern. A thickness of the high-carbon semiconductor pattern may be about two or more times greater than a thickness of the low-carbon semiconductor pattern.

Each of the control gate electrode and the peripheral gate pattern may further include an upper electrode on the low-carbon semiconductor pattern. The upper electrode may include a metal.

Each of the control gate electrode and the peripheral gate pattern may further include a barrier pattern disposed between the upper electrode and the low-carbon semiconductor pattern. The barrier pattern may include a metal nitride.

The semiconductor memory device may further include a spacer insulating layer covering a sidewall of each of the upper electrodes. The spacer insulating layer covering the sidewall of the upper electrode of the peripheral gate pattern may extend onto a sidewall of the low-carbon semiconductor pattern of the peripheral gate pattern.

The spacer insulating layer covering the sidewall of the upper electrode of the peripheral gate pattern and extending onto a sidewall of the low-carbon semiconductor pattern of the peripheral gate pattern may further extend onto a sidewall of the high-carbon semiconductor pattern of the peripheral gate pattern.

The charge storing part may include a floating gate electrode. The floating gate electrode may include a high-carbon semiconductor pattern and a low-carbon semiconductor pattern, which are sequentially stacked.

The charge storing part may include a tunnel insulating layer, a charge storing layer, and a blocking insulating layer, which are sequentially stacked on the substrate.

Embodiments are also directed to a semiconductor memory device including a first insulating pattern on a substrate; a first semiconductor layer on the first insulating pattern; a second semiconductor layer disposed on the first semiconductor layer and in contact with the first semiconductor layer; and an upper gate electrode on the second semiconductor layer. The first and second semiconductor layers include carbon. A carbon concentration of the first semiconductor layer is greater than a carbon concentration of the second semiconductor layer.

The carbon concentration of the first semiconductor layer may be about three or more times greater than the carbon concentration of the second semiconductor layer.

A thickness of the first semiconductor layer may be about two or more times greater than a thickness of the second semiconductor layer.

The semiconductor memory device may further include a barrier pattern disposed between the second semiconductor layer and the upper gate electrode.

The semiconductor memory device may further include a lower gate electrode disposed between the first insulating pattern and the first semiconductor layer, and a second insulating pattern disposed between the lower gate electrode and the first semiconductor layer. The lower gate electrode may include a third semiconductor layer disposed between the first insulating pattern and the second insulating pattern and a fourth semiconductor layer disposed between the third semiconductor layer and the second insulating pattern. A carbon concentration of the third semiconductor layer may be greater than a carbon concentration of the fourth semiconductor layer.

Embodiments are also directed to a semiconductor memory device, including a substrate including a cell region and a peripheral region, word lines on the substrate in the cell region and a peripheral gate pattern on the substrate of the peripheral region, wherein each of word lines and the peripheral gate pattern includes a first semiconductor pattern and a second semiconductor pattern, second semiconductor pattern being on the first semiconductor pattern, the first semiconductor pattern and the second semiconductor pattern including carbon, and a carbon concentration of the first semiconductor pattern being greater that a carbon concentration of the second semiconductor pattern, and the cell region includes variable resistance structures electrically connected to the word lines.

A carbon concentration of the high-carbon semiconductor pattern may be about three or more times greater than a carbon concentration of the low-carbon semiconductor pattern.

The high-carbon semiconductor pattern may be thicker than the low-carbon semiconductor pattern.

A thickness of the high-carbon semiconductor pattern may be about two or more times greater than a thickness of the low-carbon semiconductor pattern.

Each of the variable resistance structures may be an MRAM device including a reference magnetic layer, a tunnel barrier layer and a free layer sequentially stacked between a first electrode and a second electrode.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
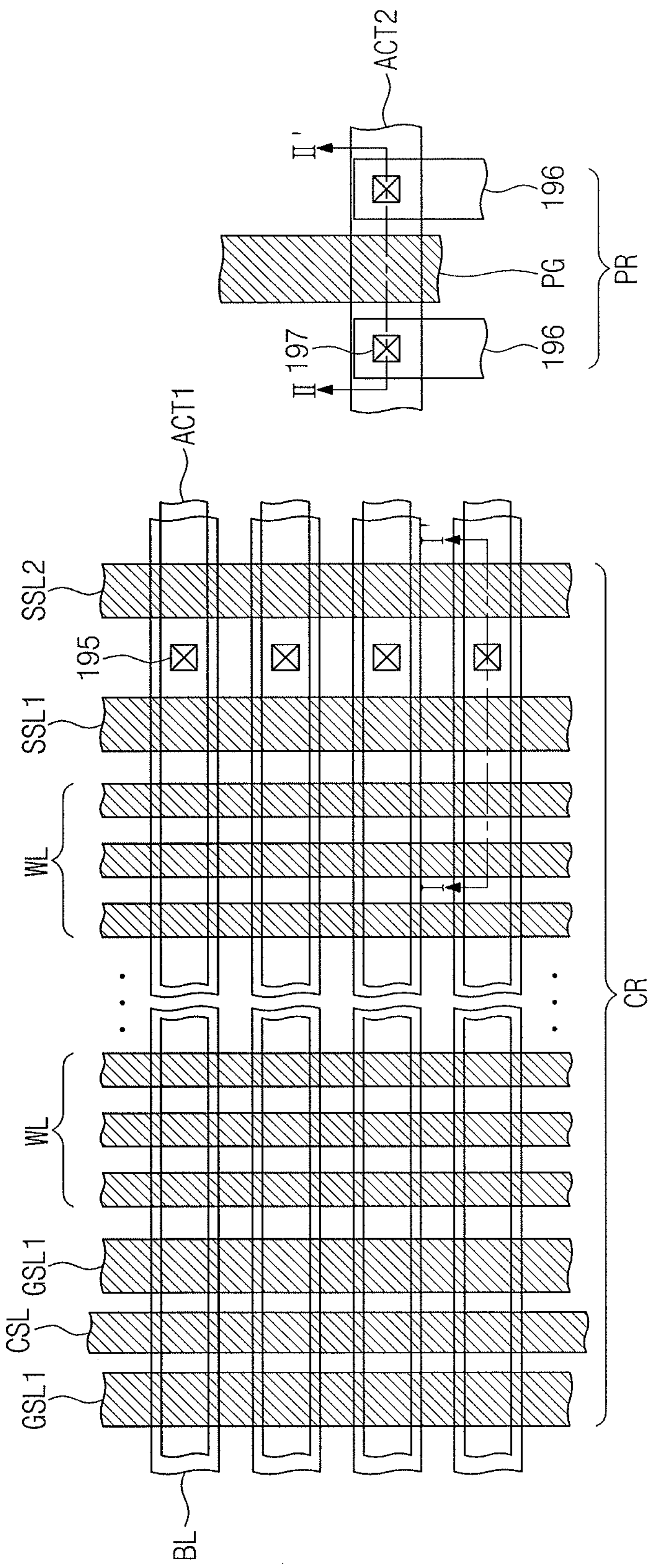
FIG. 1 illustrates a plan view showing a semiconductor memory device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it is to be understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It is also to be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments explained and illustrated herein include their complementary counterparts.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 illustrates a plan view showing a semiconductor memory device according to an embodiment. It is to be understood that various embodiments disclosed herein may have the same configuration in plan view, with differences between the embodiments becoming apparent in cross-sectional views. Accordingly, the plan view illustrated in FIG. 1 may be referred to with respect to each of these embodiments.

FIGS. 2A, 3A, 4A, 5A, 6A, 7A, and 8A illustrate cross-sectional views taken along a line I-I' of FIG. 1 to show stages of a method of manufacturing a semiconductor memory device according to an embodiment. FIGS. 2B, 3B, 4B, 5B, 6B, 7B, and 8B illustrate cross-sectional views taken along a line II-II' of FIG. 1 to show stages of the method of manufacturing a semiconductor memory device according to the embodiment. FIGS. 3C and 3D illustrate cross-sectional views illustrating a region between a region illustrated in FIG. 3A and a region illustrated in FIG. 3B.

Figure 2A:
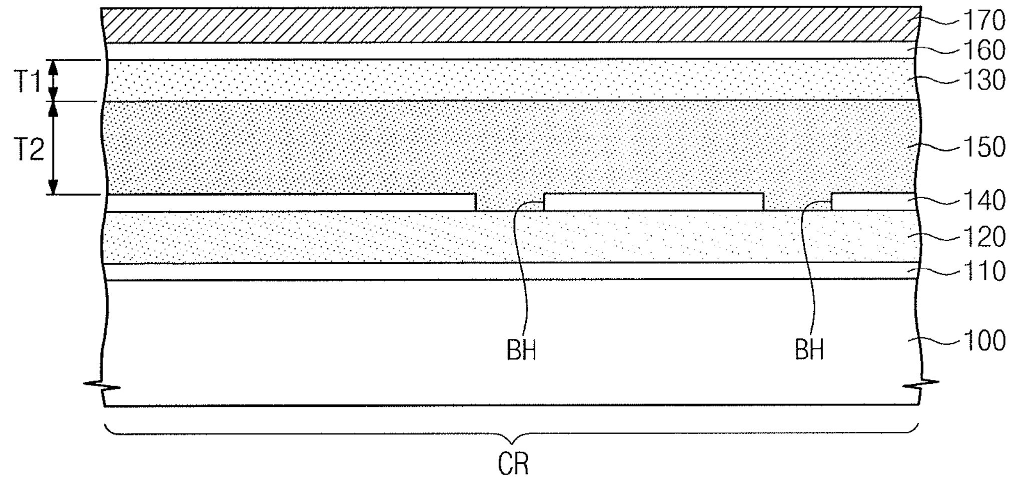
FIGS. 2A, 3A, 4A, 5A, 6A, 7A, and 8A illustrate cross-sectional views taken along a line I-I' of FIG. 1 to show stages of a method of manufacturing a semiconductor memory device according to an embodiment.
Figure 2B:
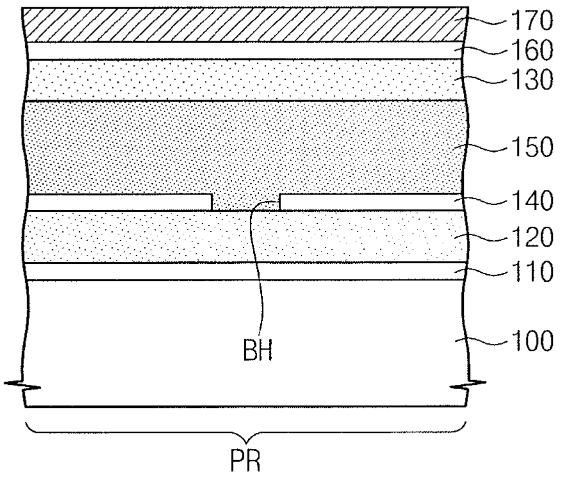
FIGS. 2B, 3B, 4B, 5B, 6B, 7B, and 8B illustrate cross-sectional views taken along a line II-II' of FIG. 1 to show the stages of the method of manufacturing a semiconductor memory device according to the embodiments.

Referring to FIGS. 1, 2A, and 2B, a substrate 100 including a cell region CR and a peripheral region PR may be provided. The substrate 100 may include at least one of materials having semiconductor properties, insulating materials, and a semiconductor or conductor covered by an insulating material. For example, the substrate 100 may be a silicon wafer. In some implementations, the substrate 100 may include a region doped with p-type dopants.

A first insulating layer 110, a conductive layer 120, and a second insulating layer 140 may be sequentially formed on the substrate 100 of the cell region CR and the peripheral region PR. In some implementations, the first insulating layer 110 may include a silicon oxide layer or a silicon oxynitride layer. The conductive layer 120 may include a semiconductor material. For example, the conductive layer 120 may be a silicon layer doped with dopants. The second insulating layer 140 may include at least one selected from a silicon oxide layer, a silicon nitride layer, and a silicon oxynitride layer. The second insulating layer 140 may include openings BH for connection of a high-carbon semiconductor layer, as will be described below.

The high-carbon semiconductor layer 150 and a low-carbon semiconductor layer 130 may be sequentially formed on the second insulating layer 140. For example, the high-carbon semiconductor layer 150 and the low-carbon semiconductor layer 130 may be silicon layers doped with carbon. A carbon concentration of the high-carbon semiconductor layer 150 may be greater than a carbon concentration of the low-carbon semiconductor layer 130. In some implementations, the carbon concentration of the high-carbon semiconductor layer 150 may be about three or more times greater than the carbon concentration of the low-carbon semiconductor layer 130. For example, the carbon concentration of the high-carbon semiconductor layer 150 may be within a range of about 3 at % to about 10 at %, and the carbon concentration of the low-carbon semiconductor layer 130 may be within a range of about 0.5 at % to about 2 at %.

The relatively high carbon concentration of the high-carbon semiconductor layer 150 may help to prevent the formation of voids that could be caused in the process of forming a semiconductor layer. A deposition process of a semiconductor layer may produce a plurality of vacancies. The vacancies may combine with each other through a subsequent thermal process to form relatively large voids. The voids may deteriorate structural and/or electrical characteristics of a semiconductor device. According to embodiments, however, carbon atoms of the high-carbon semiconductor layer 150 may block the movement of the vacancies to help reduce and/or prevent the formation of the voids in the high-carbon semiconductor layer 150.

Each of the high-carbon semiconductor layer 150 and the low-carbon semiconductor layer 130 may be doped with carbon by an in-situ method. In other implementations, after a semiconductor material constituting the high-carbon semiconductor layer 150 is formed, a first carbon doping process may be performed thereon. And then, after a semiconductor material constituting the low-carbon semiconductor layer 130 is formed, a second carbon doping process may be performed thereon.

A thickness T2 of the high-carbon semiconductor layer 150 may be greater than a thickness T1 of the low-carbon semiconductor layer 130. In some implementations, the thickness T2 of the high-carbon semiconductor layer 150 may be about two or more times greater than a thickness T1 of the low-carbon semiconductor layer 130. The high-carbon semiconductor layer 150 may be connected to the conductive layer 120 through the openings BH.

A barrier layer 160 and an upper electrode layer 170 may be sequentially formed on the low-carbon semiconductor layer 130. The upper electrode layer 170 may include a metal. For example, the upper electrode layer 170 may include at least one of tungsten (W), titanium (Ti), and tantalum (Ta). The barrier layer 160 may include at least one conductive metal nitride including at least one of the above metals. For example, the barrier layer 160 may include at least one selected from a tungsten nitride layer (WN), a titanium nitride layer (TiN), and a tantalum nitride (TaN).

Each of the layers 110, 120, 140, 150, 130, 160, and 170 may be formed by a deposition technique such as a chemical vapor deposition (CVD) process, a physical vapor deposition (PVD) method, or an atomic layer deposition (ALD). The formation process of each of the layers 110, 120, 140, 150, 130, 160, and 170 may include a thermal treatment process.

Referring to FIGS. 1, 3A, 3B, 3C, and 3D, an etching process of the upper electrode layer 170 and the barrier layer 160 may be performed. The etching process may be performed using mask patterns 182, 185, and 188. First mask patterns 182 may be mask patterns for defining the word lines WL of FIG. 1, and second mask patterns 185 may be mask patterns for defining the string selection lines SSL1 and SSL2 of FIG. 1. A third mask pattern 188 may be a mask pattern for defining a peripheral gate pattern PG of a peripheral transistor in FIG. 1. Preliminary first, second, and third upper electrodes 171, 174, and 177 and preliminary first, second, and third barrier patterns 161, 164, and 167 may be formed by the etching process using the mask patterns 182, 185, and 188. The present etching process may be performed until a top surface of a low-carbon semiconductor layer 130*a* is exposed. For example, the etching process may be a dry etching process using HBr and/or $SF_6$.

Figure 3A:
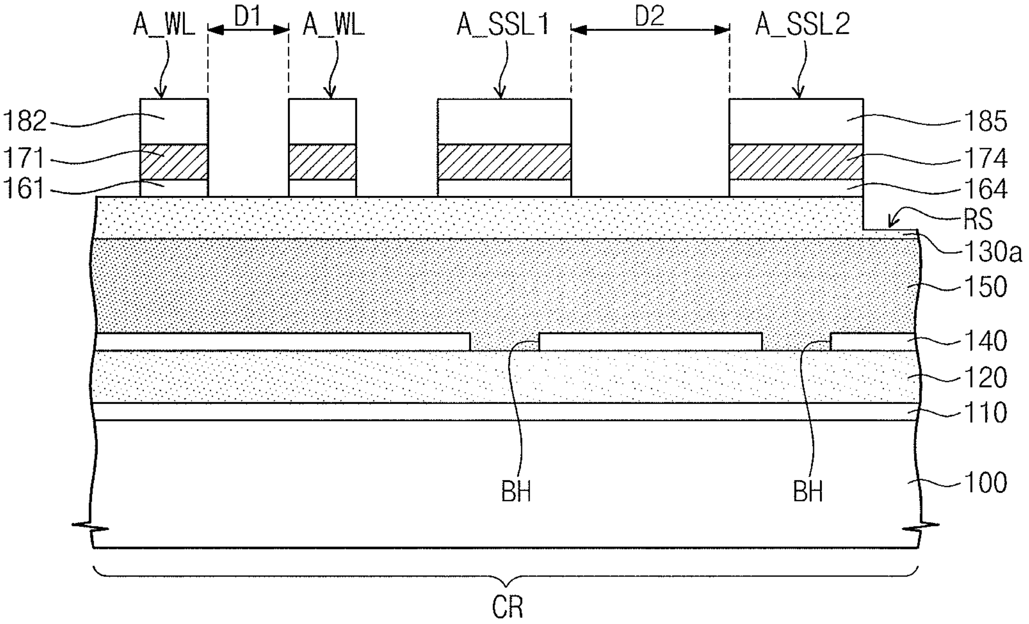
Figure 3B:
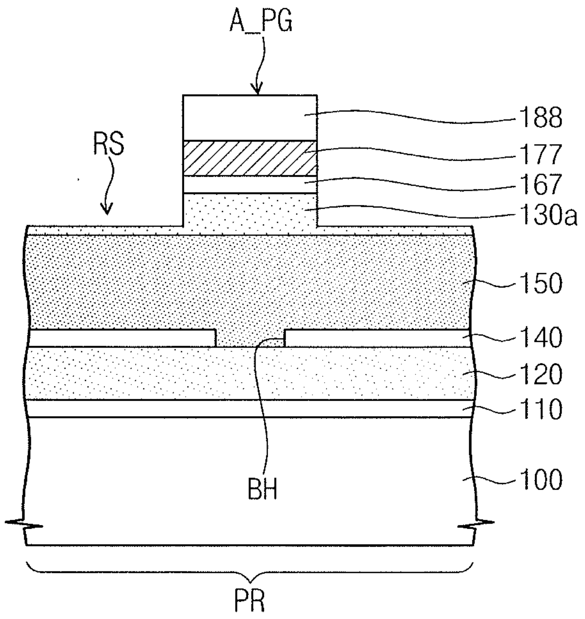
Figure 3C:
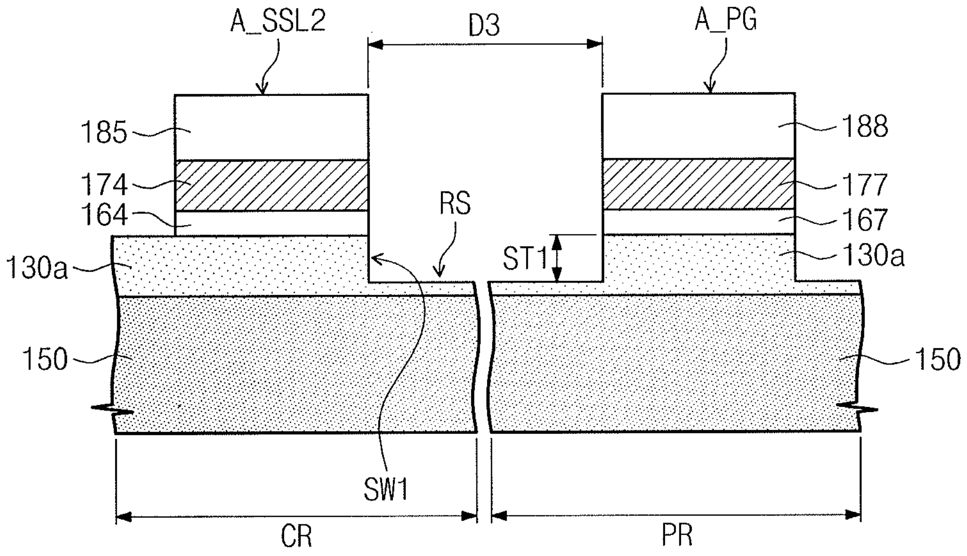
FIGS. 3C and 3D illustrate cross-sectional views showing a region between the region illustrated in FIG. 3A and the region illustrated in FIG. 3B.
Figure 3D:
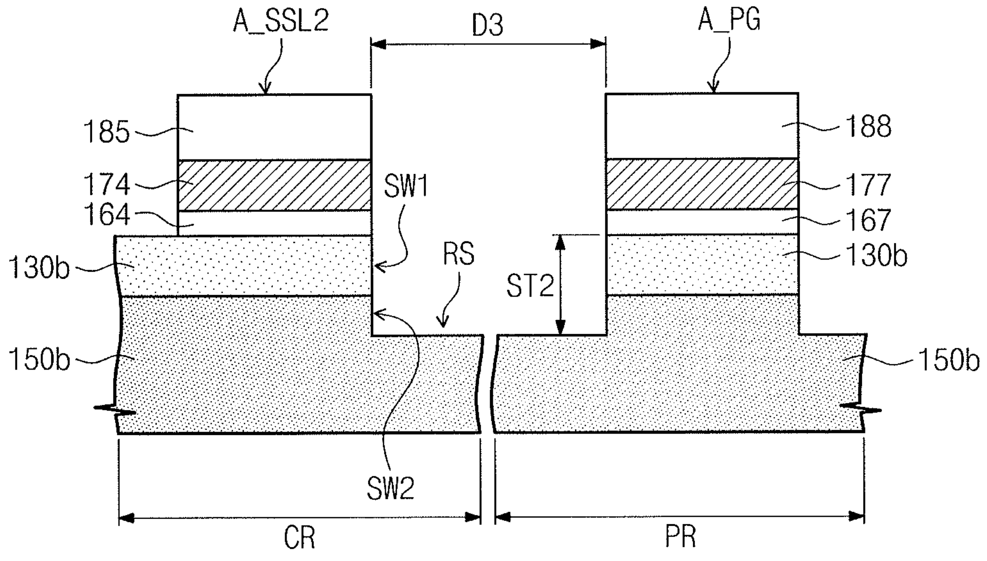

FIG. 3C illustrates a cross-sectional view of a region between a region illustrated in FIG. 3A and a region illustrated in FIG. 3B according to some embodiments. A recess region RS may be formed in an upper portion of the low-carbon semiconductor layer 130*a* as the result of the etching process. The recess region RS may be formed between the cell region CR and the peripheral region PR. In some implementations, the recess region RS may be formed between a preliminary second string selection line A_SSL2 being a portion of the second string selection line SSL2 of FIG. 1 and a preliminary peripheral gate pattern A_PG being a portion of the peripheral gate pattern PG of FIG. 1. The recess regions RS may be formed at both sides of the preliminary peripheral gate pattern A_PG. A bottom surface of the recess region RS may have a first height difference ST1 with respect to the top surface of the low-carbon semiconductor layer 130*a*. The recess region RS may expose a sidewall SW1 of the low-carbon semiconductor layer 130*a*. The recess region RS may not be substantially formed between preliminary word lines A_WL being portions of the word lines WL or between the preliminary word line A_WL and a preliminary string selection line A_SSL1 being a portion of a second string selection line SSL1 of FIG. 1.

A distance between the preliminary second string selection line A_SSL2 and the preliminary peripheral gate pattern A_PG may be greater than a distance D1 between the preliminary word lines A_WL and may be greater than a distance D2 between the preliminary string selection lines A_SSL1 and A_SSL2. For example, the distance D3 may be several tens or more times greater than each of the distances D1 and D2. If distances between patterns are different from each other by a predetermined distance or more, it is possible that etching depths may be non-uniform. This phenomenon is referred to as a "loading effect" of an etching process. The loading effect, if it occurs, may cause a bridging phenomenon such that final structures are not separated from each other, a pitting phenomenon such that a substrate between final structures is damaged, and/or a leaning phenomenon such that final structures lean toward each other.

FIG. 3D illustrates a cross-sectional view of a region between a region illustrated in FIG. 3A and a region illustrated in FIG. 3B according to another embodiment. In the present embodiment, the recess region RS may be formed to be relatively deeper than the recess region RS of the embodiment of FIG. 3C. The recess region RS of FIG. 3D may completely expose a sidewall SW1 of a low-carbon semiconductor layer 130*b* and a portion of a sidewall SW2 of a high-carbon semiconductor layer 150*b*. In the present embodiment, a bottom surface of the recess region RS of FIG. 3D may have a second height difference ST2 with respect to a top surface of the low-carbon semiconductor layer 130*b*. The second height difference ST2 may be greater than the first height difference ST1 of FIG. 3C.

Hereinafter, for the purposes of ease and convenience of description, subsequent processes will be described using the embodiment of FIG. 3C as an example.

Figure 4A:
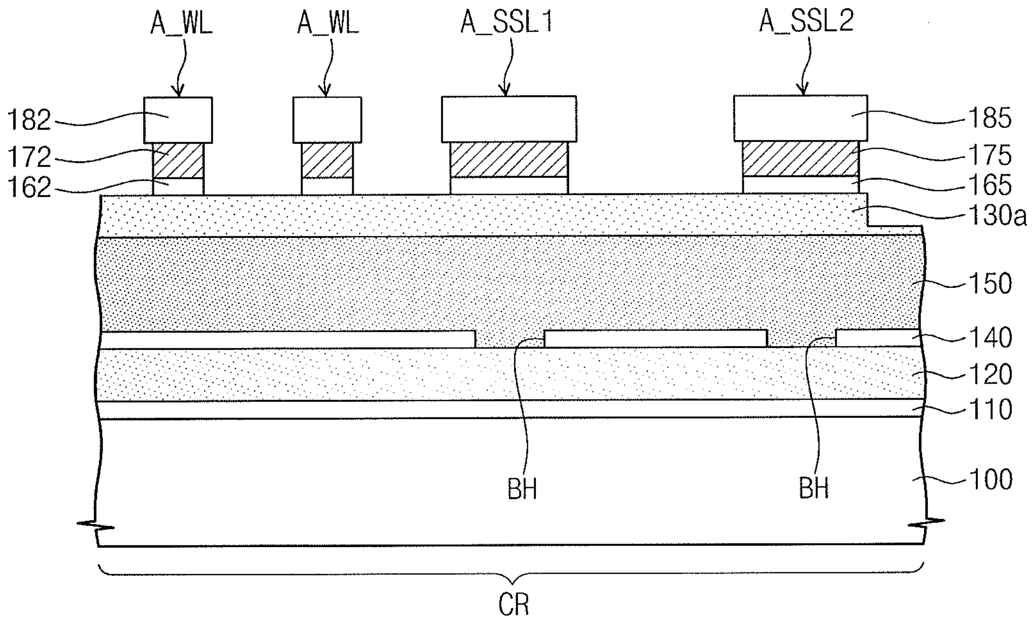
Figure 4B:
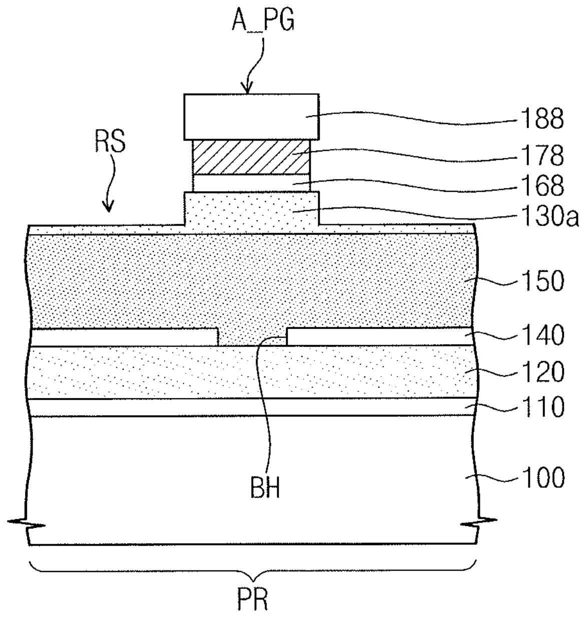

Referring to FIGS. 1, 4A, and 4B, sidewalls of the preliminary first to third upper electrodes 171, 174, and 177 may be etched to form first, second, and third upper electrodes 172, 175, and 178. In some implementations, the etching process for etching the sidewalls may be performed using ozone ($O_3$). During this etching process, sidewalls of the preliminary first to third barrier patterns 161, 164, and 167 may also be etched to form first, second, and third barrier patterns 162, 165, and 168.

Figure 5A:
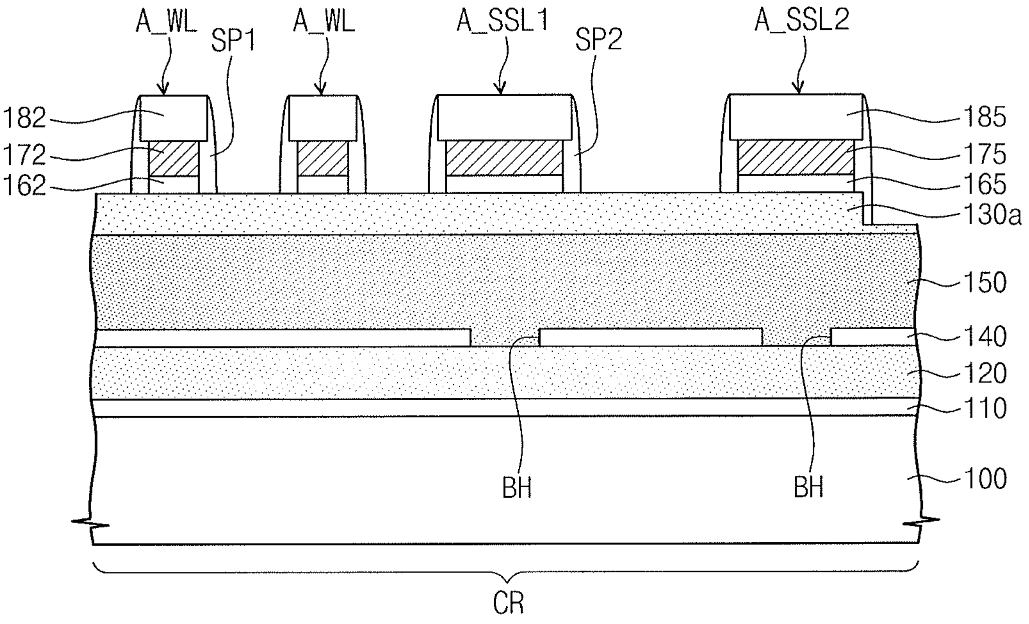
Figure 5B:
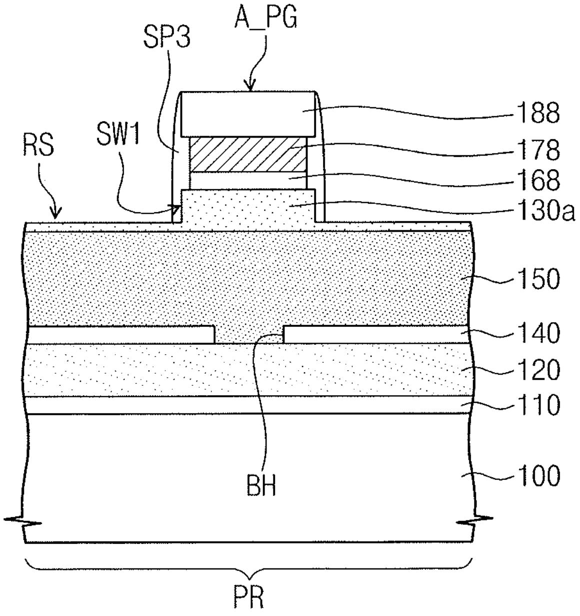

Referring to FIGS. 1, 5A, and 5B, spacer insulating layers SP1, SP2, and SP3 may be formed on the sidewalls of the first to third upper electrodes 172, 175, and 178. For example, the spacer insulating layers SP1, SP2, and SP3 may include a silicon nitride layer and/or a silicon oxynitride layer. A third spacer insulating layer SP3 formed on the sidewall of the preliminary peripheral gate pattern A_PG may extend onto the first sidewall SW1 adjacent to the preliminary peripheral gate pattern A_PG. A second spacer insulating layer SP2 formed on the sidewall of the preliminary second string selection line A_SSL2 may extend onto the first sidewall SW1 adjacent to the preliminary second string selection line A_SSL2.

Figure 6A:
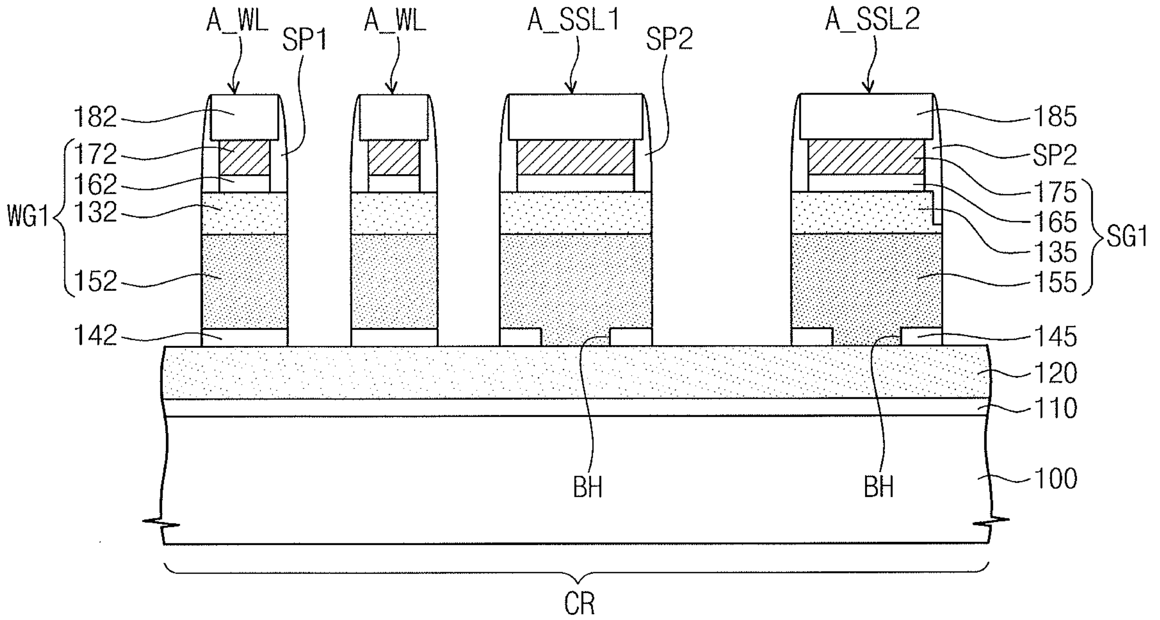
Figure 6B:
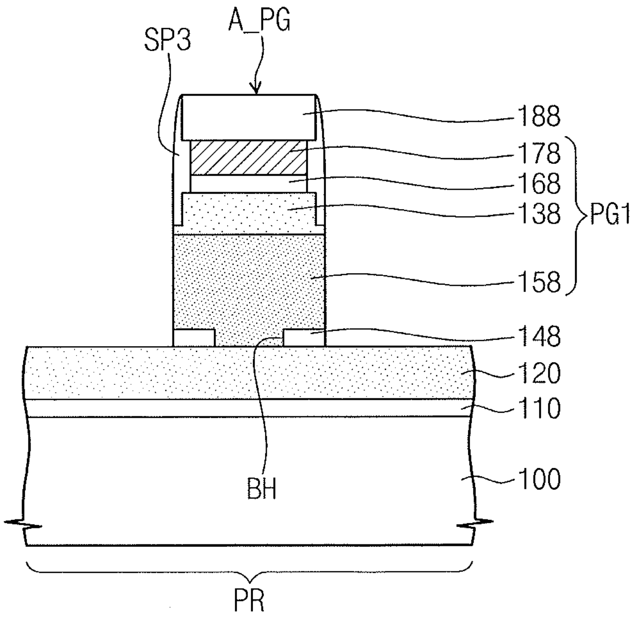

Referring to FIGS. 1, 6A, and 6B, the low-carbon semiconductor layer 130*a*, the high-carbon semiconductor layer 150, and the second insulating layer 140 may be successively etched to form first to third low-carbon semiconductor patterns 132, 135, and 138, first to third high-carbon semiconductor patterns 152, 155, and 158, and first to third blocking patterns 142, 145, and 148. A first high-carbon semiconductor pattern 152, a first low-carbon semiconductor pattern 132, a first barrier pattern 162, and a first upper electrode 172 may constitute a control gate electrode WG1. A second high-carbon semiconductor pattern 155, a second low-carbon semiconductor pattern 135, a second barrier pattern 165, and a second upper electrode 175 may constitute an upper selection gate electrode SG1. A third high-carbon semiconductor pattern 158, a third low-carbon semiconductor pattern 138, a third barrier pattern 168, and a third upper electrode 178 may constitute an upper peripheral gate electrode PG1.

A contact resistance between each of the low-carbon semiconductor patterns 132, 135, and 138 and each of the barrier patterns 162, 165, and 168 may be reduced due to relatively lower carbon concentration of each of the low-carbon semiconductor patterns 132, 135, and 138. Thus, RC delay of the semiconductor memory device may be reduced.

The high-carbon semiconductor patterns 152, 155, and 158 may have etch-resistance higher than the low-carbon semiconductor patterns 132, 135, and 138. Thus, the loading effect described above may be prevented or reduced. Due to the higher etch-resistance of the high-carbon semiconductor patterns 152, 155, and 158, the first height difference ST1 described above may be reduced, such that a top surface of the conductive layer 120 may have a profile which substantially does not have a height difference, as illustrated in FIGS. 6A and 6B. The blocking patterns 142, 145, and 148 may function as an etch stop layer. Thus, the effect removing the first height difference ST1 may be increased by the blocking patterns 142, 145, and 148.

Figure 7A:
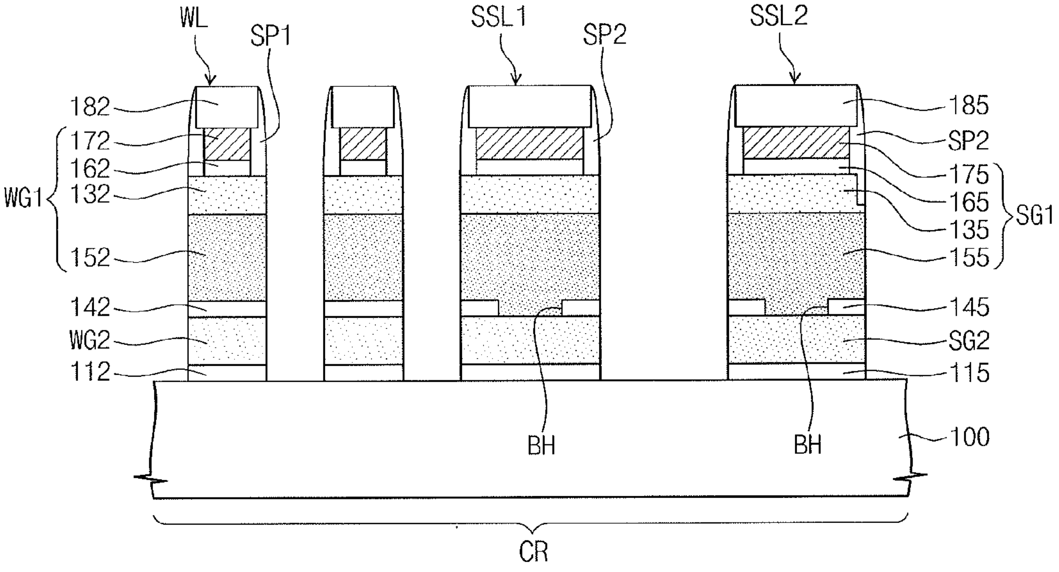
Figure 7B:
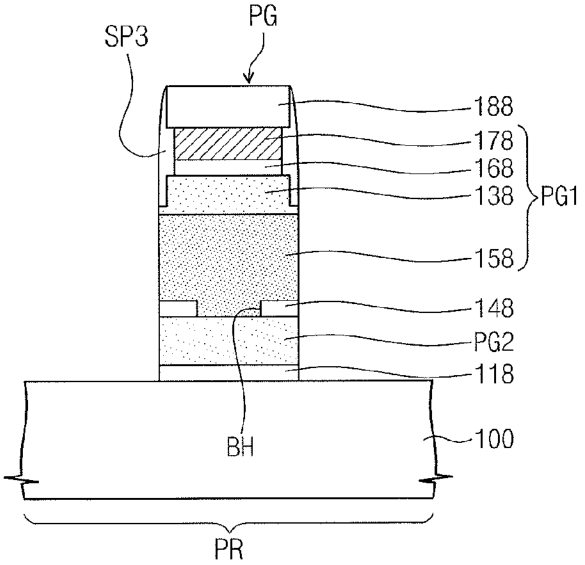

Referring to FIGS. 1, 7A, and 7B, the conductive layer 120 may be etched to form a floating gate electrode WG2, a lower selection gate electrode SG2, and a lower peripheral gate electrode PG2. The first insulating layer 110 may be etched to form a tunnel insulating layer 112, a selection gate insulating layer 115, and a peripheral gate insulating layer 118. As a result, the word lines WL and the string selection lines SSL1 and SSL2 may be formed on the substrate 100 in the cell region CR, and the peripheral gate pattern PG may be formed on the substrate 100 in the peripheral region PR.

Figure 8A:
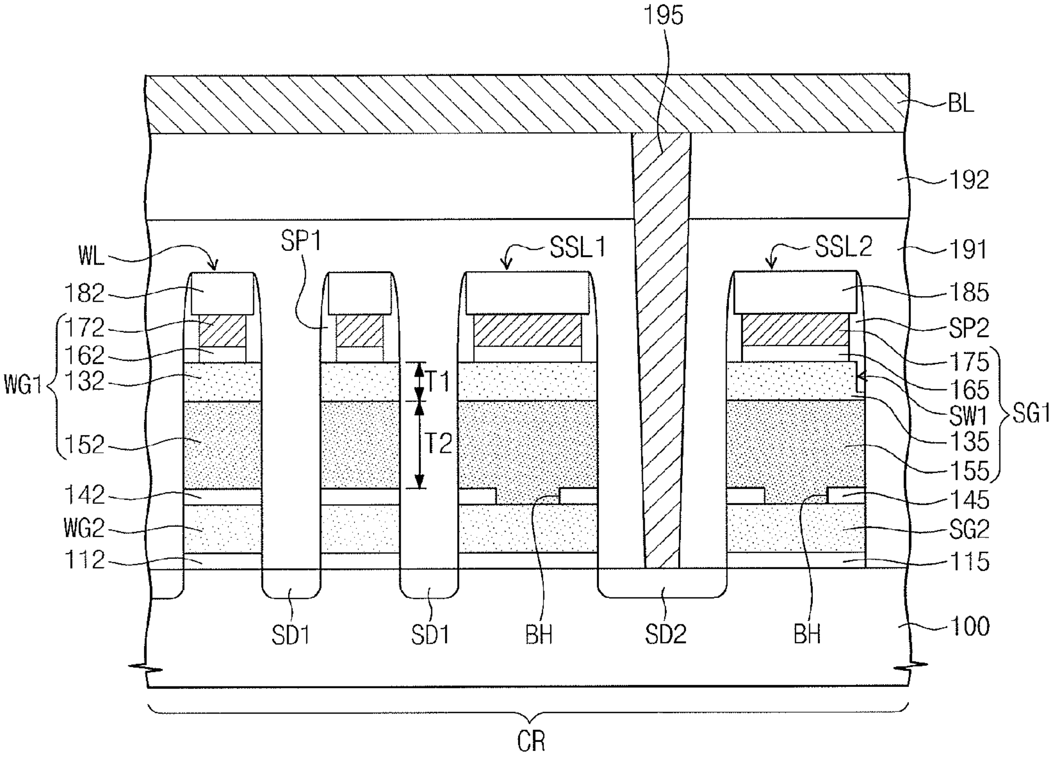
Figure 8B:
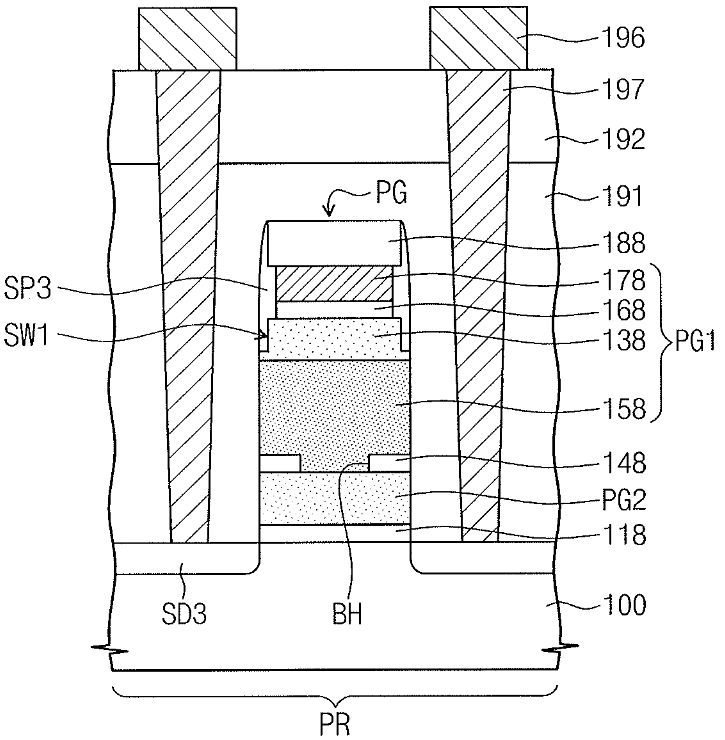

Referring to FIGS. 1, 8A, and 8B, source/drain regions may be formed in the substrate exposed by the etching process. First source/drain regions SD1 may be formed in the substrate 100 between the word lines WL and a second source/drain region SD2 may be formed in the substrate 100 between the first and second string selection lines SSL1 and SSL2. Third source/drain regions SD3 may be formed in the substrate 100 at both sides of the peripheral gate pattern PG, respectively. The source/drain regions SD1, SD2, and SD3 may be dopant-regions having a conductivity type different from a conductivity type of the substrate 10. For example, the source/drain regions SD1, SD2, and SD3 may be dopant-regions doped with n-type dopants. In other implementations, the first source/drain regions SD1 may have the same conductivity type as the substrate 100.

A first interlayer insulating layer 191 and a second interlayer insulating layer 192 may be formed on the substrate 100 including the source/drain regions SD1, SD2, and SD3. For example, each of the first and second interlayer insulating layers 191 and 192 may include a silicon oxide layer and/or a silicon oxynitride layer. Bit line contacts 195 and peripheral contacts 197 may be formed to successively penetrate the second and first interlayer insulating layers 192 and 191. Bit lines BL and peripheral interconnections 196 may be formed on the second interlayer insulating layer 192. The bit lines BL may be electrically connected to the bit line contacts 195 and the peripheral interconnections 196 may be electrically connected to the peripheral contacts 197. The bit lines BL, the peripheral interconnections 196, and the contacts 195 and 197 may be formed of a material including at least one selected from a metal, a conductive metal nitride, a doped semiconductor material, and a metal-semiconductor compound.

The semiconductor memory device according to an embodiment will be described with reference to FIGS. 1, 8A, and 8B. For the purposes of ease and convenience, duplicate descriptions will not be repeated or duplicate features will be mentioned only briefly hereinafter.

The word lines WL and the string selection lines SSL1 and SSL2 may be provided on the substrate 100 of the cell region CR. The peripheral gate pattern PG may be provided on the substrate 100 of the peripheral region PR. Each of the word lines WL may include a charge storing part and a control gate electrode WG1 which are sequentially stacked on the substrate 100. In some implementations, the charge storing part may include the floating gate electrode WG2. The tunnel insulating layer 112 may be disposed between the floating gate electrode WG2 and the substrate 100, and the first blocking pattern 142 may be disposed between the floating gate electrode WG2 and the control gate electrode WG1. Each of the string selection lines SSL1 and SSL2 may include the selection gate insulating layer 115, the lower selection gate electrode SG2, and the upper selection gate electrode SG1 which are sequentially stacked on the substrate 100. The second blocking pattern 145 may be disposed between the lower selection gate electrode SG2 and the upper selection gate electrode SG1. The lower and upper selection gate electrodes SG2 and SG1 may be connected to each other through the opening BH in the second blocking pattern 145. The peripheral gate pattern PG may include the peripheral gate insulating layer 118, the lower peripheral gate electrode PG2, and the upper peripheral gate electrode PG1, which are sequentially stacked on the substrate 100. The third blocking pattern 148 may be disposed between the lower and upper peripheral gate electrodes PG2 and PG1. The lower and upper peripheral gate electrodes PG2 and PG2 may be connected to each other through the opening BH in the third blocking pattern 148.

The control gate electrode WG1, the upper selection gate electrode SG1, and the upper peripheral gate electrode PG1 may include the high-carbon semiconductor patterns 152, 155, and 158 and the low-carbon semiconductor patterns 132, 135, and 138 disposed on the high carbon semiconductor patterns 152, 155, and 158. For example, the carbon concentration of each of the high-carbon semiconductor patterns 152, 155, and 158 may be about three or more times greater than the carbon concentration of each of the low-carbon semiconductor patterns 132, 135, and 138. The low-carbon semiconductor patterns 132, 135, and 138 may reduce the contact resistance of the semiconductor memory device due to the low carbon concentration thereof, such that the RC delay may be improved. The high carbon content of the high-carbon semiconductor patterns 152, 155, and 158 may reduce or prevent voids during formation of the high-carbon semiconductor layer 150, as described above, and may reduce the loading effect during the patterning to form high-carbon semiconductor patterns 152, 155, and 158 due to the high etch-resistance thereof. The thickness T2 of each of the high-carbon semiconductor patterns 152, 155, and 158 may be about two or more times greater than the thickness T1 of the low-carbon semiconductor patterns 132, 135, and 138. When the high-carbon semiconductor patterns 152, 155, and 158 are thicker than the low-carbon semiconductor patterns 132, 135, and 138, the loading effect may be more effectively reduced.

The control gate electrode WG1, the upper selection gate electrode SG1, and the upper peripheral gate electrode PG1 may further include the upper gate electrodes 172, 175, and 178, respectively. The upper electrodes 172, 175, and 178 may include metal, such that it is possible to reduce the resistances of the word lines WL1, the string selection lines SSL1 and SSL2, and the peripheral gate pattern PG. The barrier patterns 162, 165, and 168 may be disposed between the upper electrodes 172, 175, and 178 and the low-carbon semiconductor patterns 132, 135, and 138, respectively. The barrier patterns 162, 165, and 168 may help prevent and/or reduce material-diffusion between the upper electrodes 172, 175, and 178 and the low-carbon semiconductor patterns 132, 135, and 138. Additionally, the barrier patterns 162, 165, and 168 may help improve (i.e., reduce) contact resistance between the upper electrodes 172, 175, and 178 and the low-carbon semiconductor patterns 132, 135, and 138.

The spacer insulating layers SP1, SP2, and SP3 may be disposed on the sidewalls of the upper electrodes 172, 175, and 178. The second spacer insulating layer SP2 and the third spacer insulating layer SP3 may extend downward onto the sidewalls SW1 of the low-carbon semiconductor patterns 135 and 138, respectively.

Figure 8C:
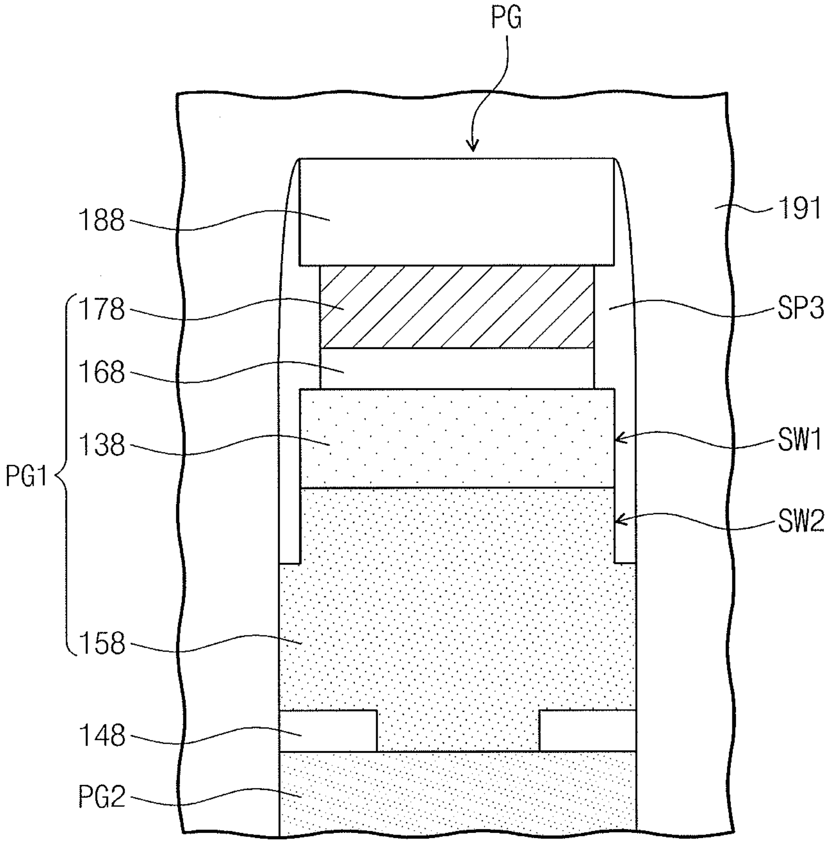
FIG. 8C illustrates a cross-sectional view showing a peripheral transistor according to another embodiment.

FIG. 8C illustrates a cross-sectional view of a peripheral transistor according to another embodiment. For the purposes of ease and convenience, descriptions for the same elements in the above embodiment will not be repeated, or such elements will be mentioned only briefly hereinafter. In the present embodiment, as described with reference to FIG. 3D, the recess region RS exposes the sidewall SW1 of the low-carbon semiconductor layer 103*b* and the sidewall SW2 of the high-carbon semiconductor layer 105*b*. In the present embodiment, the third spacer insulating layer SP3 may extend downward onto the sidewall SW1 of the third low-carbon semiconductor pattern 138 and the sidewall SW2 of the third high-carbon semiconductor pattern 158.

In the embodiments described above, the area between the second string selection SSL2 and the peripheral gate pattern PG may be susceptible to the loading effect during etching processes. An area between a first ground selection line GSL1 of FIG. 1 and a peripheral gate pattern (not shown) adjacent thereto may also be susceptible to the loading effect during etching processes. The use of the low-carbon semiconductor layer and the high-carbon semiconductor layer according to embodiments may reduce or prevent the loading effect from occurring between the second string selection SSL2 and the peripheral gate pattern PG and may also reduce or prevent the loading effect from occurring between the first ground selection line GSL1 and the peripheral gate pattern (not shown) adjacent thereto.

In the aforementioned embodiments, the semiconductor memory device may be a NAND flash memory device. In other implementations, the semiconductor memory device may be a NOR flash memory device. In the NOR flash memory device, the loading effect occurring between an outermost word line of a cell region and a peripheral gate pattern may also be reduced.

Figure 9A:
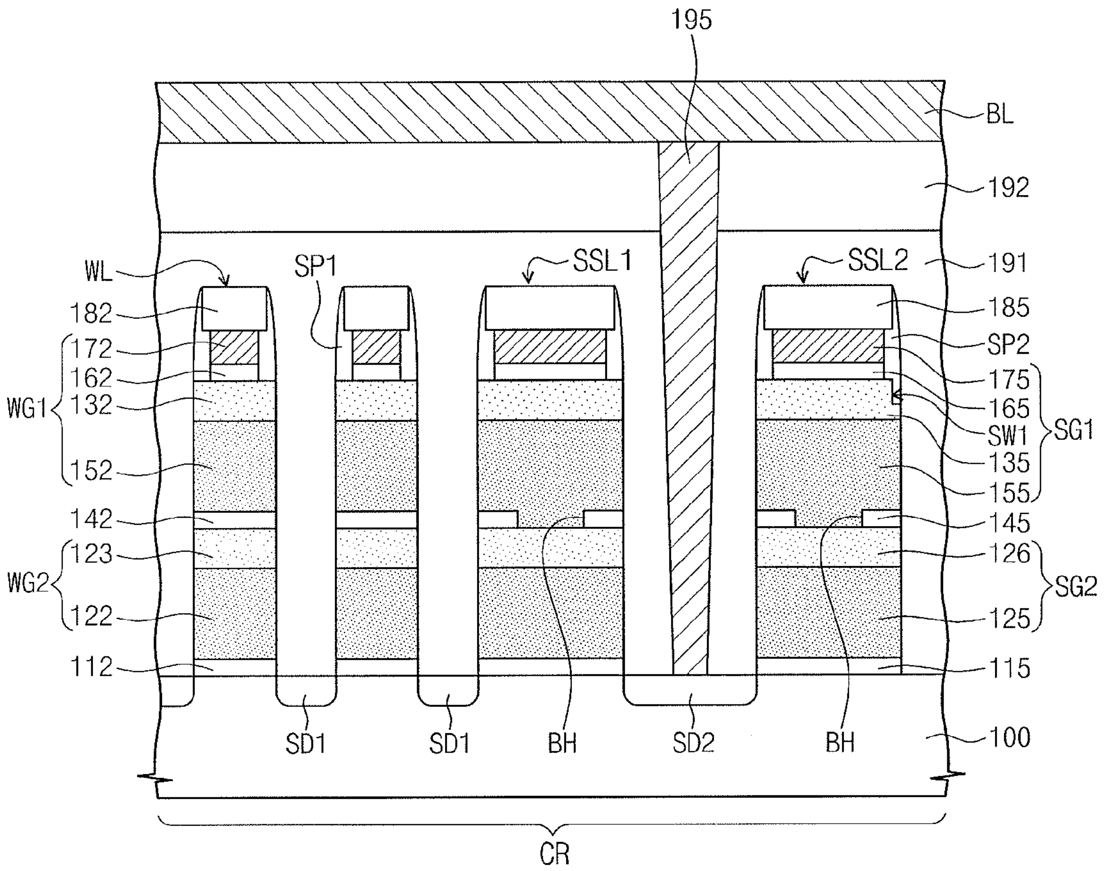
FIGS. 9A and 9B illustrate cross-sectional views taken along a line I-I' and a line II-II' of FIG. 1, respectively, showing a semiconductor memory device according to another embodiment.
Figure 9B:
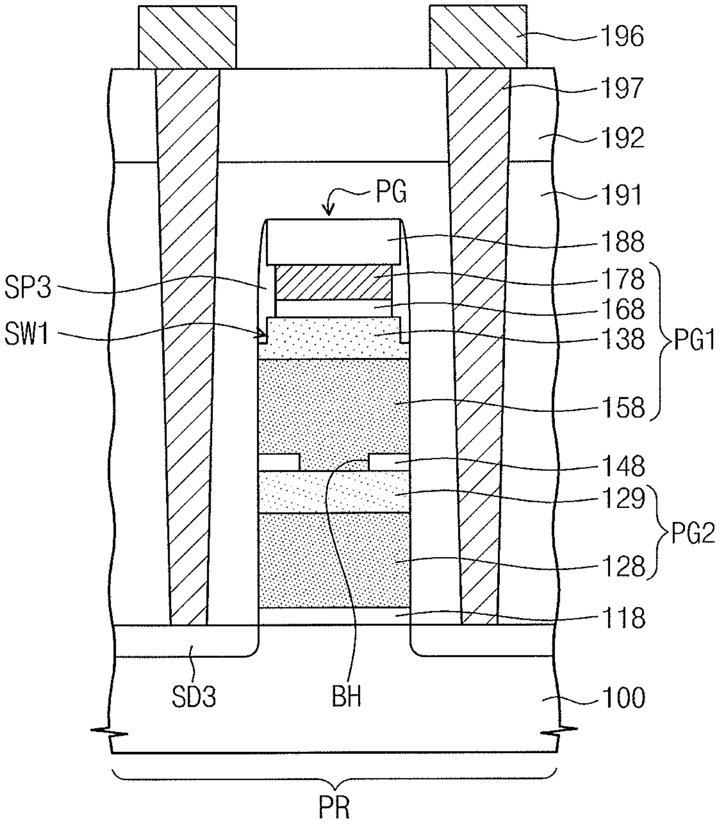

FIGS. 9A and 9B illustrate cross-sectional views taken along line I-I' and line II-II' of FIG. 1, respectively, to show a semiconductor memory device according to another embodiment. For the purposes of ease and convenience, descriptions for the same elements in the above embodiment will not be repeated, or such elements will be mentioned only briefly.

In the present embodiment, a floating gate electrode WG2, a lower selection gate electrode SG2, and a lower peripheral gate electrode PG2 may include high-carbon semiconductor patterns 122, 125, and 128 and low-carbon semiconductor patterns 123, 126, and 129 respectively disposed on the high-carbon semiconductor patterns 122, 125, and 128. A carbon concentration of each of the high-carbon semiconductor patterns 122, 125, and 128 may be about three or more times greater than a carbon concentration of each of the low-carbon semiconductor patterns 123, 126, and 129. A thickness of each of the high-carbon semiconductor patterns 122, 125, and 128 may be about two or more times greater than a thickness of each of the low-carbon semiconductor patterns 123, 126, and 129.

Figure 10A:
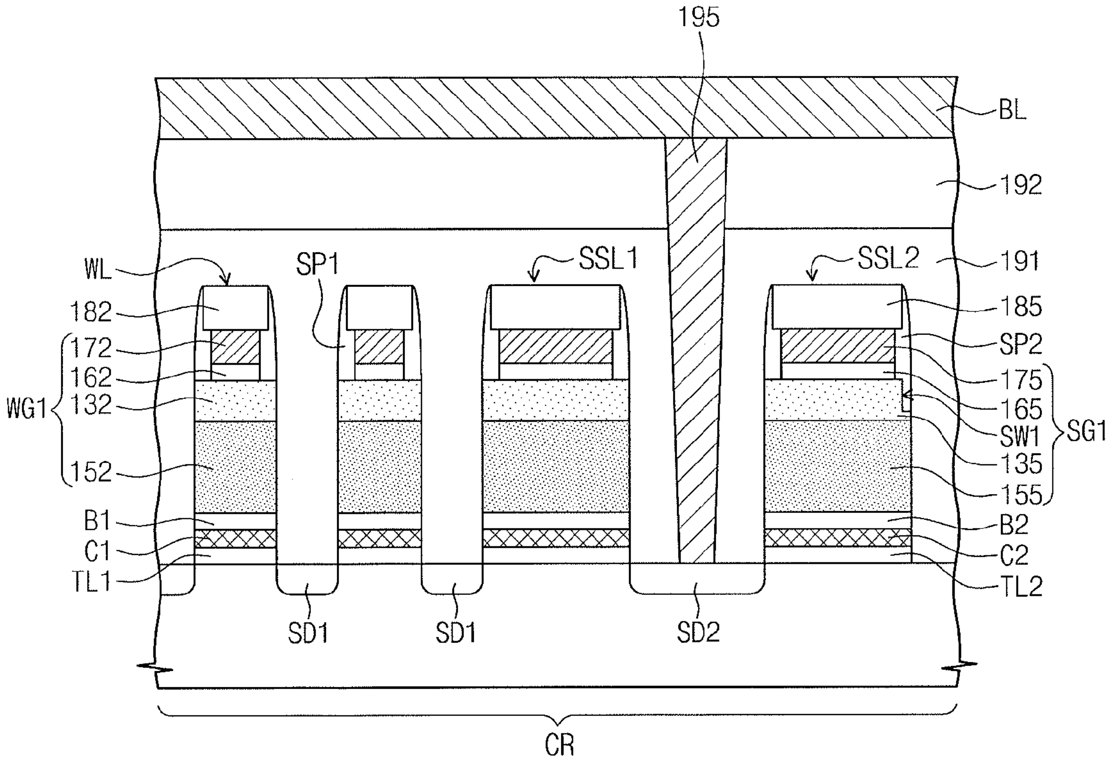
FIGS. 10A and 10B illustrate cross-sectional views taken along a line I-I' and a line II-IF of FIG. 1, respectively, showing a semiconductor memory device according to another embodiment.
Figure 10B:
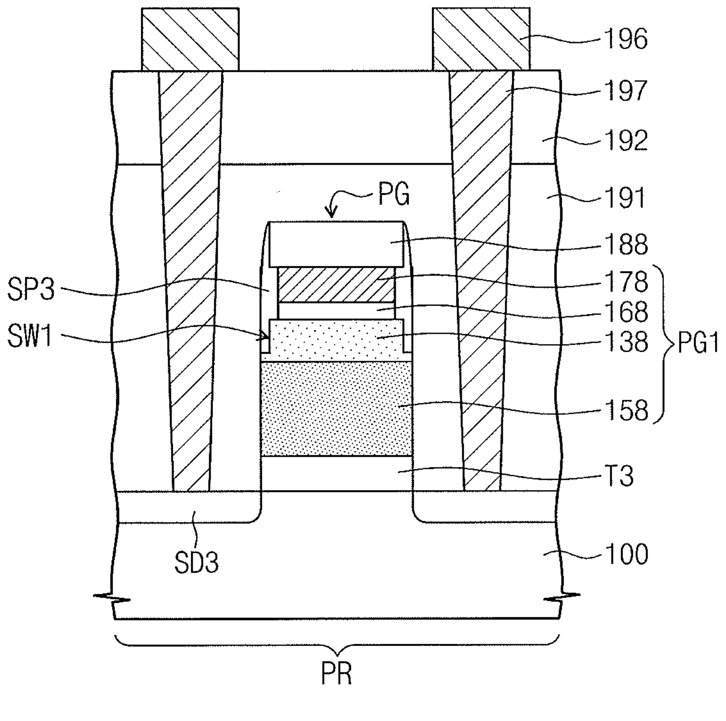

FIGS. 10A and 10B illustrate cross-sectional views taken along line I-I' and line II-II' of FIG. 1, respectively, to show a semiconductor memory device according to another embodiment. For the purposes of ease and convenience, descriptions for the same elements in the above embodiments will not be repeated or such elements will be mentioned only briefly.

In the present embodiment, a charge storing part between the control gate electrode WG1 and the substrate 100 may include a first tunnel insulating pattern TL1, a first charge storing pattern C1, and a first blocking insulating pattern B1. A second tunnel insulating pattern TL2, a second charge storing pattern C2, and a second blocking insulating pattern B2 may be disposed between the upper selection gate electrode SG1 and the substrate 100.

The charge storing patterns C1 and C2 may include one of insulating layers rich with trap sites and insulating layers including nano particles. The charge storing patterns C1 and C2 may be formed by at least one of a chemical vapor deposition (CVD) process and an atomic layer deposition (ALD) process. For example, the charge storing patterns C1 and C2 may include at least one selected from a trap insulating layer, a floating gate electrode, and a insulating layer including conductive nano dots. For example, the charge storing patterns C1 and C2 may include at least one selected from a silicon nitride layer, a silicon oxynitride layer, a silicon-rich nitride layer, a nanocrystalline silicon layer, and a laminated trap layer.

The tunnel insulating patterns TL1 and TL2 may be formed of at least one material having an energy band gap greater than that of each of the charge storing patterns C1 and C2. The tunnel insulating patterns TL1 and TL2 may be formed by a CVD process or an ALD process. For example, the tunnel insulating patterns TL1 and TL2 may include silicon oxide formed by the CVD process or the ALD process. Additionally, a predetermined thermal treatment process may further be performed after the deposition process for the formation of the tunnel insulating patterns TL1 and TL2 is performed. The thermal treatment process may be a rapid thermal nitridation (RTN) process or an annealing process performed under an atmosphere including at least one of nitrogen and oxygen.

Each of the blocking insulating patterns B1 and B2 may be a single layer. In another implementation, each of the blocking insulating patterns B1 and B2 may include a first blocking insulating layer and a second blocking insulating layer. One of the first and second blocking insulating layers may include materials having an energy band gap less than that of the respective tunnel insulating patterns TL1 and TL2 and greater than that of the respective charge storing patterns C1 and C2. In some implementations, the first blocking insulating layer may include at least one high-k dielectric layer, such as an aluminum oxide layer or a hafnium oxide layer, and the second blocking insulating layer may be formed of a material having a dielectric constant less than that of the first blocking insulating layer. In other implementations, the second blocking insulating layer may include at least one high-k dielectric layer, and the first blocking insulating layer may be formed of a material having a dielectric constant less than that of the second blocking insulating layer.

A peripheral gate insulating pattern T3 may be disposed between the upper peripheral gate electrode PG1 and the substrate 100. The peripheral gate insulating pattern T3 may be formed simultaneously with the tunnel insulating patterns TL1 and TL2 or the blocking insulating patterns BL1 and BL2. In another implementation, the peripheral gate insulating pattern T3 may be formed by an additional process.

Figure 11:
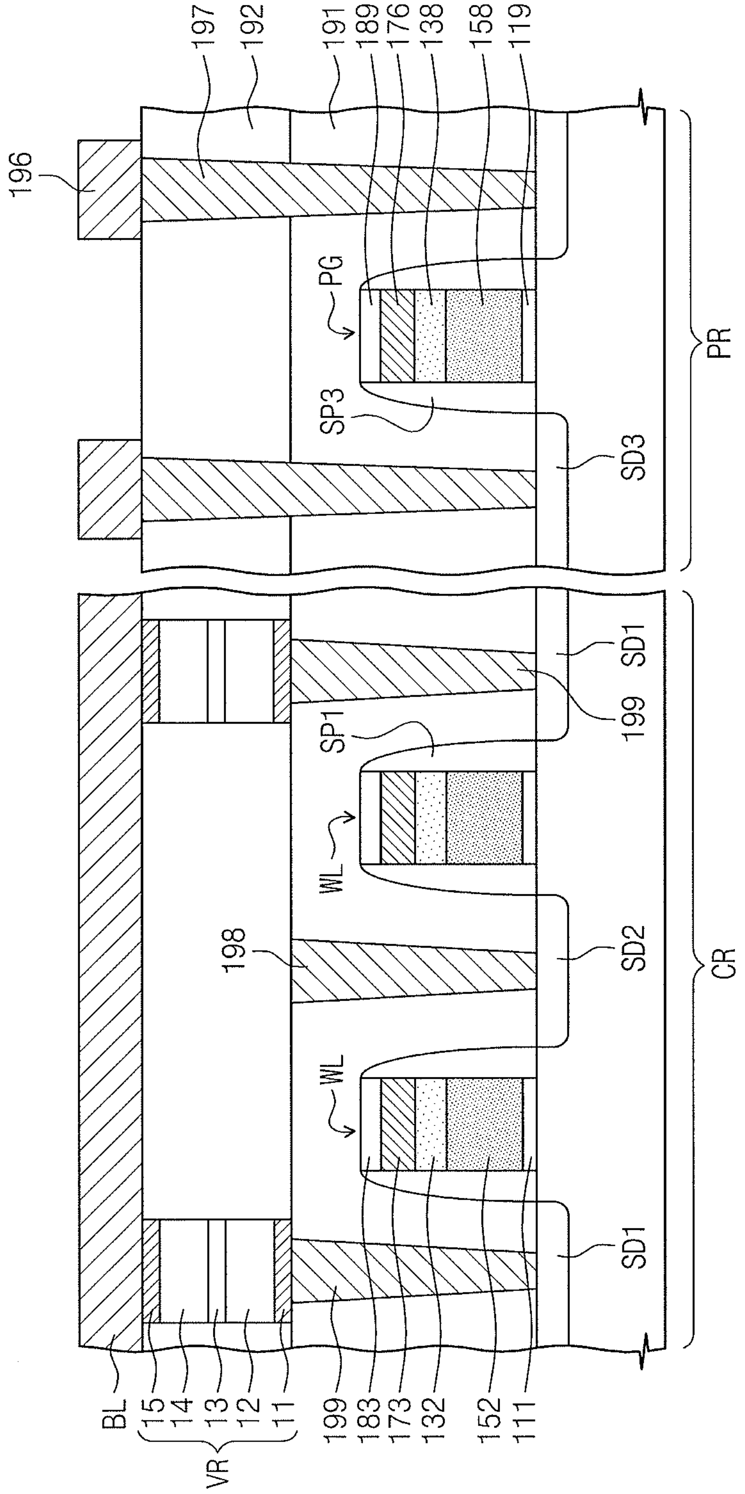
FIG. 11 illustrates a cross-sectional view showing a semiconductor memory device according to another embodiment.

FIG. 11 illustrates a cross-sectional view illustrating a semiconductor memory device according to another embodiment. For the purposes of ease and convenience, descriptions for the same elements in the above embodiments will not be repeated, or such elements will be mentioned only briefly.

In the present embodiment, word lines WL in a cell region CR do not include data storing parts. The semiconductor memory device according to the present embodiment may include variable resistance structures VR electrically connected to the word lines WL. For example, if the semiconductor memory device according to the present embodiment is a magnetic random access memory (MRAM) device, each of the variable resistance structures VR may include a magnetic tunnel junction (MTJ) pattern. In other implementations, the technical features according may be applied to a phase change random access memory (PRAM) device, a ferroelectric random access memory (FRAM) device, and/or a resistive random access memory (RRAM) device. Hereinafter, for the purposes of ease and convenience, the MRAM device will be described as an example.

Referring to FIG. 11, each of the variable resistance structures VR may include a reference magnetic layer 12, a tunnel barrier layer 13, and a free layer 14 which are sequentially stacked between a first electrode 11 and a second electrode 15. In some implementations, positions of the reference magnetic layer 12 and the free layer 14 may be changed with each other. One or more reference magnetic layers 12 and one or more free layers 14 may be provided in the variable resistance structure VR. A resistance value of the magnetic tunnel junction of the variable resistance structure VR may be changed depending on magnetization directions of the reference magnetic layer 12 and the free layer 14. For example, if the magnetization directions of the reference magnetic layer 12 and the free layer 14 are anti-parallel to each other, the magnetic tunnel junction may have a relatively high resistance value. If the magnetization directions of the reference magnetic layer 12 and the free layer 14 are parallel to each other, the magnetic tunnel junction may have a relatively low resistance value. The MRAM device may write/read data using the difference between the resistance values. The variable resistance structures VR may be provided in the second interlayer insulating layer 192. The bit lines BL may be connected to the variable resistance structures VR and may cross the word lines WL.

The variable resistance structures VR may be electrically connected to first source/drain regions SD1 formed at sides of the word lines WL through contacts 199 penetrating the first interlayer insulating layer 191. Second source/drain regions SD2 may be disposed in the substrate 100 between the word lines WL. The second source/drain regions SD2 may be connected to each other by a common source line 198. A peripheral gate pattern PG may be provided on the substrate 100 in the peripheral region PR. The third source/drain regions SD2 at both sides of the peripheral gate pattern PG may be electrically connected to peripheral interconnections 196 through contacts 197.

Each of the word lines WL may include a first gate insulating pattern 111, a first high-carbon semiconductor pattern 152, a first low-carbon semiconductor pattern 132, a first upper electrode 173, and a first capping pattern 183. The peripheral gate pattern PG may include a second gate insulating pattern 119, a second high-carbon semiconductor pattern 158, a second low-carbon semiconductor pattern 138, a second upper electrode 176, and a second capping pattern 189. At least some of layers constituting the word lines WL and the peripheral gate pattern PG may be formed simultaneously. In this case, an area between the cell region CR and the peripheral region PR may be susceptible to the loading effect during formation. In some implementations, the use of the low-carbon semiconductor patterns 132 and 138 may reduce contact resistances of the upper electrodes 173 and 176, and the use of a high-carbon semiconductor layer 150 to form the high-carbon semiconductor patterns 152 and 158 may reduce the loading effect.

Figure 12:
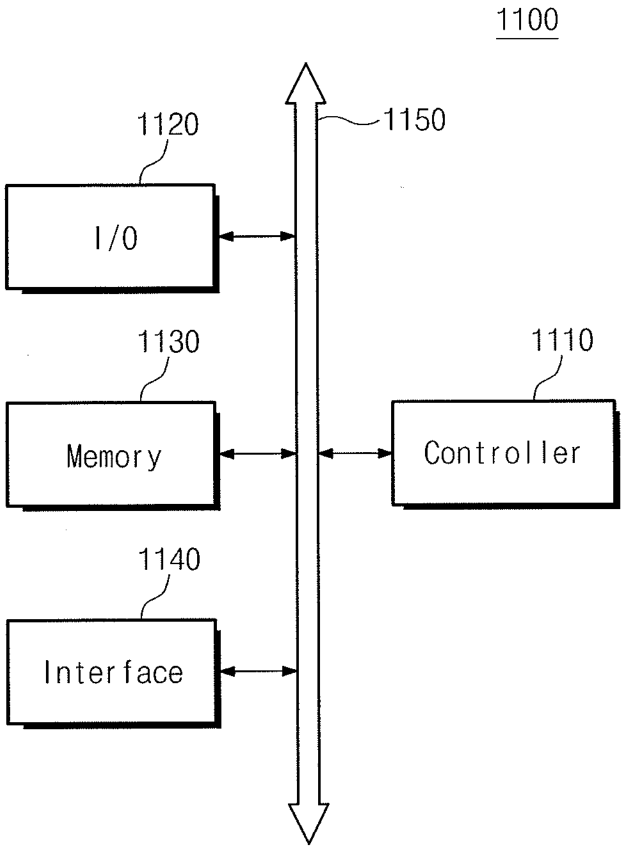
FIG. 12 illustrates a schematic block diagram showing an example of a memory system including a semiconductor memory device according to an embodiment.

FIG. 12 illustrates a schematic block diagram showing an example of a memory system including a semiconductor memory device according to an embodiment.

Referring to FIG. 12, a memory system 1100 may be applied to a personal digital assistant (PDA), a portable computer, a web tablet, a wireless phone, a mobile phone, a digital music player, a memory card or other electronic products. The other electronic products may receive or transmit information data wirelessly.

The memory system 1100 may include a controller 1110, an input/output (I/O) unit 1120, a memory device 1130, an interface unit 1140, and a data bus 1150. The memory device 1130 and the interface unit 1140 may communicate with each other through the data bus 1150.

The controller 1110 may include at least one of a microprocessor, a digital signal processor, a microcontroller, or other logic devices. The other logic devices may have a similar function to any one of the microprocessor, the digital signal processor and the microcontroller. The memory device 1130 may store data and/or commands performed by the controller 1110. The I/O unit may receive data or signals from the outside of the system 1100 or transmit data or signals to the outside of the system 1100. For example, the I/O unit 1120 may include a keypad, a keyboard and/or a display unit.

The memory device 1130 may include at least one of the semiconductor memory devices according to embodiments herein. The memory device 1130 may further include at least one of other various kinds of memory devices, such as a volatile memory device capable of randomly accessing data.

The interface unit 1140 may transmit electrical data to a communication network and/or may receive electrical data from a communication network.

Figure 13:
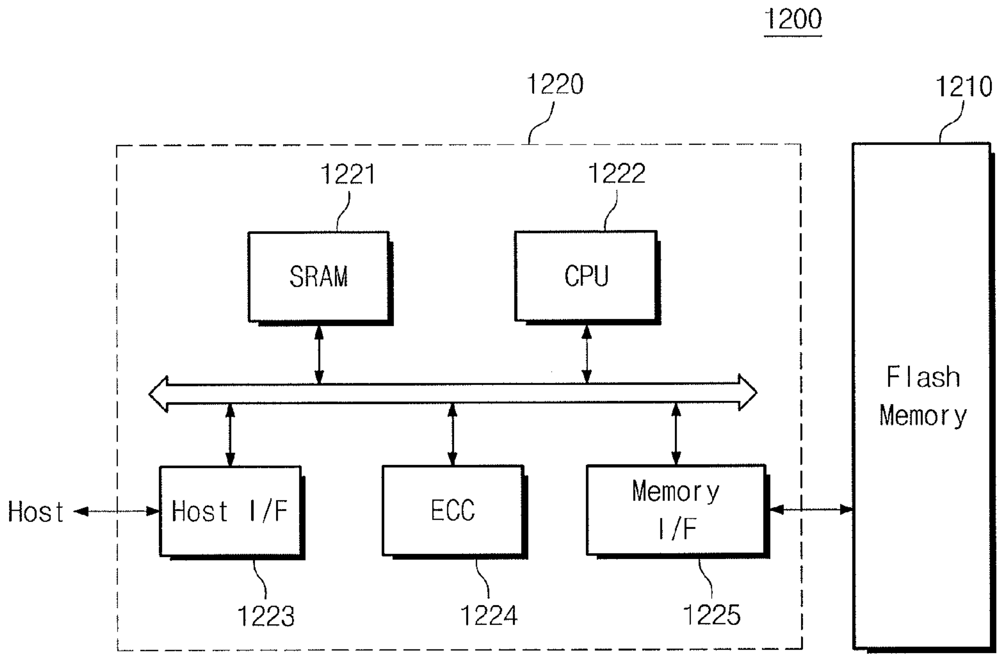
FIG. 13 illustrates a schematic block diagram showing an example of a memory card including a semiconductor memory device according to an embodiment.

FIG. 13 illustrates a schematic block diagram showing an example of a memory card including a semiconductor memory device according to an embodiment.

Referring to FIG. 13, a memory card 1200 for supporting mass data storage may include a flash memory device 1210 including a semiconductor memory device according to embodiments. The memory card 1200 may include a memory controller 1220 that controls data communication between a host and the memory device 1210.

A static random access memory (SRAM) 1221 may be used as an operation memory of a central processing unit (CPU) 1222. A host interface unit 1223 may be configured to include a data communication protocol between the memory card 1200 and the host. An error check and correction (ECC) block 1224 may detect and correct errors of data which are read out from the memory device 1210. A memory interface unit 1225 may interface with the flash memory device 1210 according to embodiments. A central processing unit (CPU) 1222 may control overall operations for data exchange of the memory controller 1220. The memory card 1200 may further include a read only memory (ROM) device that stores code data to interface with the host.

Figure 14:
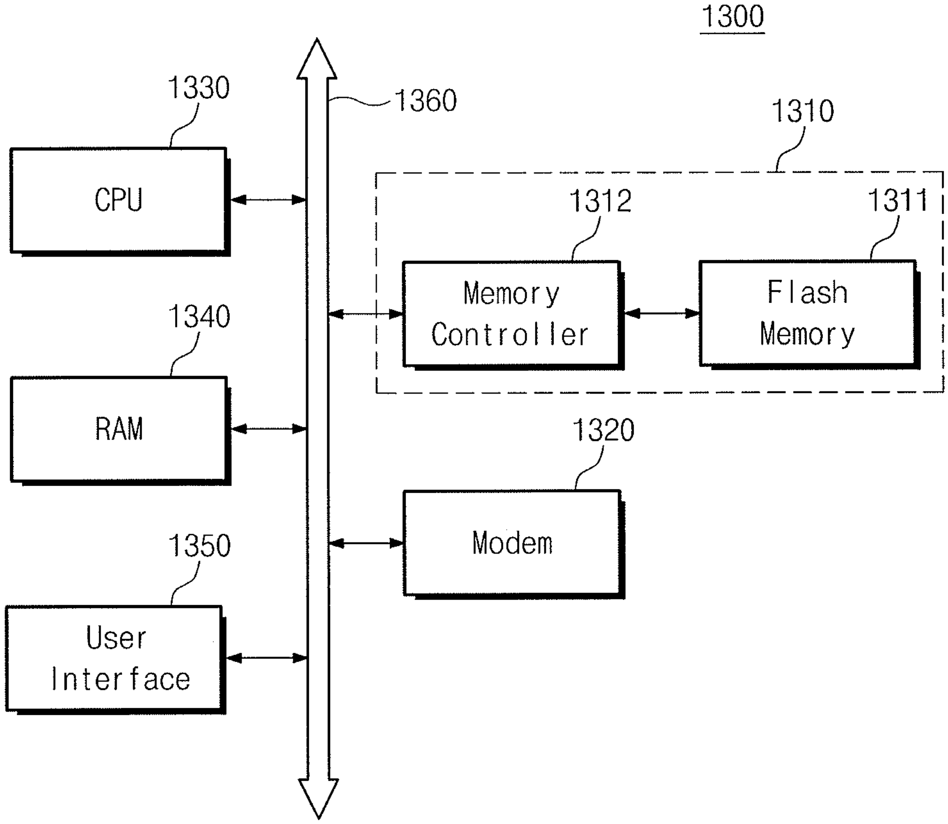
FIG. 14 illustrates a schematic block diagram showing an example of an information processing system including a semiconductor memory device according to an embodiment.

FIG. 14 illustrates a schematic block diagram showing an example of an information processing system including a semiconductor memory device according to embodiments.

Referring to FIG. 14, a flash memory system 1310 may be installed in an information process system 1300 such as a mobile device or a desktop computer. The information process system 1300 may include a modem 1320, a central processing unit (CPU) 1330, a random access memory (RAM) 1340, and a user interface unit 1350 that are electrically connected to the flash memory system 1310 through a system bus 1360. The flash memory system 1310 may be substantially the same as the aforementioned memory system or flash memory system. Data processed by the CPU 1330 or data inputted from the outside of flash memory system 1310 may be stored in the flash memory system 1310. The flash memory system 1310 may be a solid state disk (SSD) device. In this case, the information processing system 1300 may stably store massive data in the flash memory system 1310. Additionally, as the reliability of the flash memory system 1310 increases, a resource consumed for correcting errors in the flash memory system 1310 may be reduced. An application chipset, a camera image processor (CIS), or an input/output unit may further be provided in the information processing system 1300.

Additionally, the flash memory devices or the memory systems according to embodiments may be encapsulated using various packaging techniques. For example, the flash memory devices or the memory systems according to embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

According to embodiments, an etching process used to form the semiconductor memory device may be uniformly performed throughout an entire region of a wafer. According to embodiments, it may be possible to reduce or prevent a bridging, pitting, or leaning phenomenon that may be caused between the cell region and the peripheral region during etching. According to embodiments, it may possible to reduce or prevent the formation of voids in a semiconductor layer. According to embodiments, the contact resistance between stacked gates may be improved.

Accordingly, embodiments may provide semiconductor memory devices having structures that allow a uniform etching process to be performed. Embodiments therefore may provide semiconductor memory devices having improved electrical characteristics Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:

a substrate including a cell region and a peripheral region;

word lines on the substrate in the cell region, each of the word lines including a sequentially stacked charge storing part and control gate electrode; and a peripheral gate pattern on the substrate in the peripheral region, wherein each of the control gate electrode and the peripheral gate pattern includes a high-carbon semiconductor pattern and a low-carbon semiconductor pattern, the low-carbon semiconductor pattern being on the high-carbon semiconductor pattern.

2. The semiconductor memory device as claimed in claim 1, wherein a carbon concentration of the high-carbon semiconductor pattern is about three or more times greater than a carbon concentration of the low-carbon semiconductor pattern.

3. The semiconductor memory device as claimed in claim 1, wherein the high-carbon semiconductor pattern is thicker than the low-carbon semiconductor pattern.

4. The semiconductor memory device as claimed in claim 3, wherein a thickness of the high-carbon semiconductor pattern is about two or more times greater than a thickness of the low-carbon semiconductor pattern.

5. The semiconductor memory device as claimed in claim 1, wherein:

each of the control gate electrode and the peripheral gate pattern further includes an upper electrode on the low-carbon semiconductor pattern, and the upper electrode includes a metal.

6. The semiconductor memory device as claimed in claim 5, wherein:

each of the control gate electrode and the peripheral gate pattern further includes a barrier pattern disposed between the upper electrode and the low-carbon semiconductor pattern, and the barrier pattern includes a metal nitride.

7. The semiconductor memory device as claimed in claim 5, further comprising a spacer insulating layer covering a sidewall of each upper electrode, wherein the spacer insulating layer covering the sidewall of the upper electrode of the peripheral gate pattern extends onto a sidewall of the low-carbon semiconductor pattern of the peripheral gate pattern.

8. The semiconductor memory device as claimed in claim 7, wherein the spacer insulating layer covering the sidewall of the upper electrode of the peripheral gate pattern and extending onto a sidewall of the low-carbon semiconductor pattern of the peripheral gate pattern further extends onto a sidewall of the high-carbon semiconductor pattern of the peripheral gate pattern.

9. The semiconductor memory device as claimed in claim 1, wherein:

the charge storing part includes a floating gate electrode; and the floating gate electrode includes a high-carbon semiconductor pattern and a low-carbon semiconductor pattern, which are sequentially stacked.

10. The semiconductor memory device as claimed in claim 1, wherein the charge storing part includes a tunnel insulating layer, a charge storing layer, and a blocking insulating layer, which are sequentially stacked on the substrate.

* * * * *